(12) United States Patent
Glenn et al.

(10) Patent No.: US 6,577,013 B1
(45) Date of Patent: Jun. 10, 2003

(54) CHIP SIZE SEMICONDUCTOR PACKAGES WITH STACKED DIES

(75) Inventors: Thomas P. Glenn, Gilbert, AZ (US); Steven Webster, Chandler, AZ (US); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 33 days.

(21) Appl. No.: 09/655,439

(22) Filed: Sep. 5, 2000

(51) Int. Cl.$^7$ ............................................. H01L 23/48
(52) U.S. Cl. .................. 257/777; 257/618; 257/620; 257/621; 257/686; 438/460; 438/461; 438/462
(58) Field of Search ................................. 257/618, 620, 257/621, 686; 438/460, 461, 462

(56) References Cited

U.S. PATENT DOCUMENTS

| | | | |
|---|---|---|---|
| 3,851,221 A | 11/1974 | Beaulieu et al. ............ 317/100 |
| 4,103,318 A | 7/1978 | Schwede .................... 361/388 |
| 4,361,261 A | 11/1982 | Elles et al. ................. 228/103 |
| 4,444,349 A | 4/1984 | Bilane et al. ............... 228/102 |
| 4,586,642 A | 5/1986 | Dreibelbis et al. .......... 228/4.5 |
| 4,730,232 A | 3/1988 | Lindberg .................... 361/381 |
| 4,763,188 A | 8/1988 | Johnson ...................... 357/74 |
| 4,982,265 A | 1/1991 | Watanabe et al. ............ 357/75 |
| 5,025,306 A | 6/1991 | Johnson et al. .............. 357/75 |
| 5,040,052 A | 8/1991 | McDavid ..................... 357/80 |
| 5,140,404 A | 8/1992 | Fogal et al. ................. 357/70 |
| 5,172,215 A | 12/1992 | Kobayashi et al. .......... 257/584 |
| 5,176,311 A | 1/1993 | Levine et al. ............... 228/179 |
| 5,177,032 A | 1/1993 | Fogal et al. ................. 437/220 |
| 5,229,647 A | 7/1993 | Gnadinger ................... 257/785 |
| 5,291,060 A | 3/1994 | Shimizu et al. ............. 257/667 |
| 5,291,061 A | 3/1994 | Ball ........................... 257/686 |
| 5,323,060 A | 6/1994 | Fogal et al. ................. 257/777 |
| 5,384,689 A | 1/1995 | Shen .......................... 361/761 |
| 5,432,729 A | 7/1995 | Carson et al. ................ 365/63 |
| 5,620,928 A | 4/1997 | Lee et al. .................... 438/118 |
| 5,682,062 A * | 10/1997 | Gaul .......................... 257/686 |
| 5,721,452 A | 2/1998 | Fogal et al. ................. 257/685 |
| 5,739,581 A | 4/1998 | Chillara et al. ............. 257/668 |
| 5,815,372 A | 9/1998 | Gallas ........................ 361/760 |
| 5,872,025 A | 2/1999 | Cronin et al. ............... 438/109 |
| 5,886,412 A | 3/1999 | Fogal et al. ................. 257/777 |
| 5,888,884 A * | 3/1999 | Wojnarowski ............... 438/460 |
| 5,989,982 A | 11/1999 | Yoshikazu ................... 438/462 |
| 6,002,163 A | 12/1999 | Wojnarowski ............... 257/620 |
| 6,005,778 A | 12/1999 | Spielberger et al. ........ 361/770 |
| 6,013,948 A * | 1/2000 | Akram et al. ................ 257/680 |
| 6,030,855 A | 2/2000 | Bertin et al. ................ 438/109 |
| RE36,613 E | 3/2000 | Ball ........................... 257/777 |
| 6,033,931 A | 3/2000 | Hoffman et al. ............. 438/109 |
| 6,051,886 A | 4/2000 | Fogal et al. ................. 257/777 |
| 6,057,598 A | 5/2000 | Payne et al. ................. 257/723 |

FOREIGN PATENT DOCUMENTS

| | | | | |
|---|---|---|---|---|
| JP | 61059862 A | 3/1986 | .......... H01L/25/04 |
| JP | 61117858 A | 6/1986 | .......... H01L/25/08 |
| JP | 62119952 A | 6/1987 | .......... H01L/25/04 |
| JP | 62126661 A | 6/1987 | .......... H01L/25/04 |
| JP | 62126661 | 6/1987 | .......... H01L/25/04 |
| JP | 62142341 A | 6/1987 | .......... H01L/25/04 |
| JP | 63128736 | 6/1988 | .......... H01L/23/04 |
| JP | 63211663 A | 9/1988 | .......... H01L/25/08 |
| JP | 63244654 | 10/1988 | .......... H01L/23/28 |
| JP | 01099248 A | 4/1989 | .......... H01L/25/08 |
| JP | 04028260 A | 1/1992 | ......... H01L/25/065 |
| JP | 04056262 A | 2/1992 | ......... H01L/25/065 |
| JP | 4056262 | 2/1992 | ......... H01L/25/065 |
| JP | Hei 10-56470 | 9/1998 | ......... H01L/25/065 |

* cited by examiner

Primary Examiner—David Nelms
Assistant Examiner—Mai-Huong Tran
(74) Attorney, Agent, or Firm—Bever, Hoffman & Harms, LLP; James E. Parsons

(57) ABSTRACT

Chip-size semiconductor packages ("CSPs") containing multiple stacked dies are disclosed. The dies are mounted on one another in a stack such that corresponding ones of the vias in the respective dies are coaxially aligned. An electrically conductive wire or pin is in each set of aligned vias and soldered to corresponding ones of the terminal pads. The pins include portions protruding from the stack of dies that serve as input-output terminals of the package. Heat spreaders can be interleaved between the stacked dies to enhance heat dissipation from the package.

28 Claims, 6 Drawing Sheets

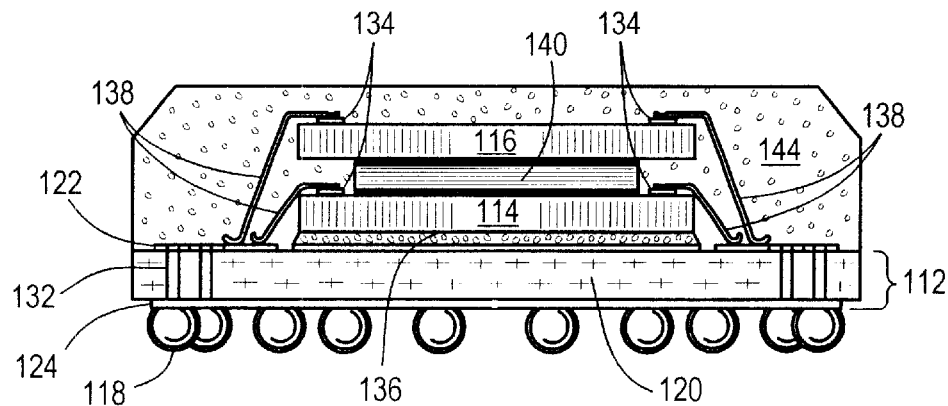
*Fig. 1 - Prior Art*
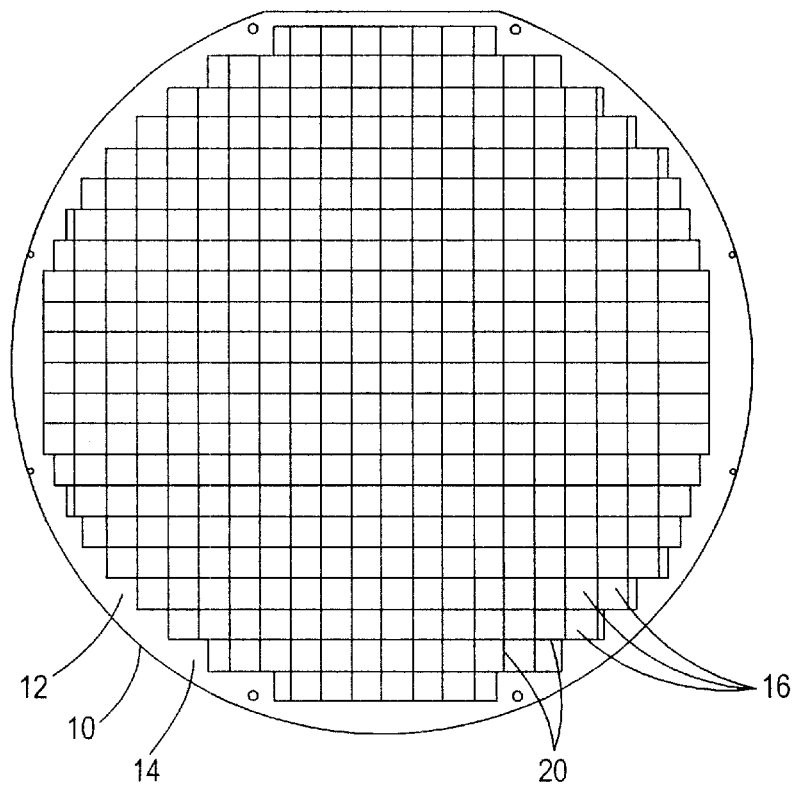
*Fig. 2 - Prior Art*

CHIP SIZE SEMICONDUCTOR PACKAGES WITH STACKED DIES

RELATED APPLICATIONS

This Application is related to U.S. application Ser. No. 09/654978, filed Sep. 5, 2000, now U.S. Pat. No. 6,406,934, issued Jun. 18, 2002.

BACKGROUND

1. Technical Field

This invention pertains to semiconductor packaging in general, and in particular, to making chip size semiconductor packages ("CSPs") having stacked dies and requiring no interconnective substrate.

2. Related Art

The increasing demand for electronic devices that are smaller, lighter, and yet more functional has resulted in the development of so-called chip-size semiconductor packages ("CSPs") having outline and mounting ("O&M") dimensions that are only slightly larger than those of the semiconductor die, or "chip," packaged therein. Another result has been the development of techniques for stacking two or more semiconductor dies on top of one another within the package. Examples of die-stacking techniques may be found, for example, in U.S. Pat. No. 5,682,062 to S. J. Gaul; U.S. Pat. No. 5,323,060 to R. Fogel, et al.; U.S. Pat. No. 5,815,372 to W. N. Gallas; U.S. Pat. No. Re. 36,613 to M. B. Ball; U.S. Pat. No. 5,721,452 to R. Fogel, et al.; and, Japanese Patent Disclosures 62-126661, 4-56262, 63-128736, and 10-256470.

FIG. 1 is a cross-sectional side elevation view of a conventional ball grid array ("BGA") type of package 110. The package 110 includes two stacked dies 114 and 116 mounted on a substrate 112. The connective substrate 112 illustrated comprises a layer 120 of an insulative material, e.g., a polyimide resin film, laminated between top and bottom conductive layers 122, 124 of a metal, e.g., copper or aluminum, that have been patterned using conventional photo-etching techniques.

A plurality of bonded wires 138 electrically connect bonding pads 134 on the peripheries of the respective dies 114, 116 to bonding pads in the top conductive layer 122 of the substrate 112. Vias 132, i.e., plated-through holes, electrically connect the top conductive layer 122 to the bottom conductive layer 124. Input-output ("I-O") terminal balls 118 are mounted on the bottom conductive layer 124. Accordingly, the dies 114, 116 are electrically connected to the balls 118. The bottom die 114 is attached to the top surface of the substrate 112 with an adhesive layer 136. The top die 116 is attached to, and vertically spaced from, the bottom die 114 by another adhesive layer 140. An insulative plastic mold cap 144 protectively encapsulates the dies 114, 116, wire bonds 138, and the top surface of the substrate 112.

Other types of packages having stacked dies include a metal leadframe instead of an insulative substrate. See, e.g., U.S. Pat. No. Re. 36,613, above.

It may be seen in each of the stacked-die packages described above, including the stacked-die CSP 110 illustrated in FIG. 1, that a large portion of the size, complexity, and hence, expense, of the package is associated with the inter-connective substrate 112 and the connections of the dies 114 and 116 to it. It would therefore be desirable if the cost, complexity and size added to the package by the substrate 112 could be reduced or eliminated. It would further be desirable if the molding operation used to form the mold cap 144 could also be eliminated.

BRIEF SUMMARY

This invention provides a method for making chip-size semiconductor packages ("CSPs") with stacked dies that eliminates the expense, complexity, and added size of an interconnective substrate, such as a laminate or a lead frame, in the package, as well as the molding operation conventionally used to encapsulate the dies in a protective plastic body.

One embodiment of the method includes the provision of a semiconductor wafer having a plurality of semiconductor dies formed integrally therein. Each die has opposite first and second surfaces and an electronic integrated circuit ("IC") device formed in the first surface thereof. One or more conventional wire bonding terminal pads are located on the first surface of each die around its periphery and are electrically connected to the electronic device in the die internally thereof.

A via having walls with an insulative coating thereon is formed through the dies and each terminal pad thereon. The vias are burned through the dies and terminal pads with a laser, and in one embodiment, at a temperature high enough to form the insulative coating on the walls of the vias simultaneously with their formation. The walls of the vias can be tapered to facilitate the insertion of pins into them, and can be plated with an electrically conductive material to facilitate electrical connection of the pins to the dies. When processing of the wafer is complete, the dies are "singulated," i.e., separated, from the wafer, e.g., by sawing.

Two or more of the singulated dies are then stacked on top of one another and electrically connected to form a CSP with stacked dies. In one embodiment, the vias in each die of the stack are slid, one die at a time, over the ends of a corresponding plurality of electrically conductive pins held in a fixture, until the desired number of dies in the stack has been obtained, and the pins are then soldered to corresponding ones of the terminal pads on the respective dies. In another embodiment, the dies are held stacked on top of one another in a fixture such that corresponding vias in each die are held in coaxial alignment with each other. An electrically conductive pin is then inserted through each set of aligned vias and soldered to corresponding ones of the terminal pads on the respective dies.

In one embodiment, a portion of each conductive pin protrudes below the first; or bottommost, die in the stack and comprises an input-output terminal of the package. In another embodiment, heat spreaders are interleaved between the dies to conduct heat away from the dies and to the surrounding ambient.

A better understanding of the above and other features and advantages of the invention may be had from a consideration of the detailed description below of some exemplary embodiments thereof, particularly if such consideration is made in conjunction with the appended drawings.

BRIEF DESCRIPTION OF THE DRAWINGS

FIG. 1 is a cross-sectional elevation view into a conventional semiconductor package containing two stacked dies in accordance with the prior art;

FIG. 2 is a top plan view of a conventional semiconductor wafer;

DETAILED DESCRIPTION

Figure 3:
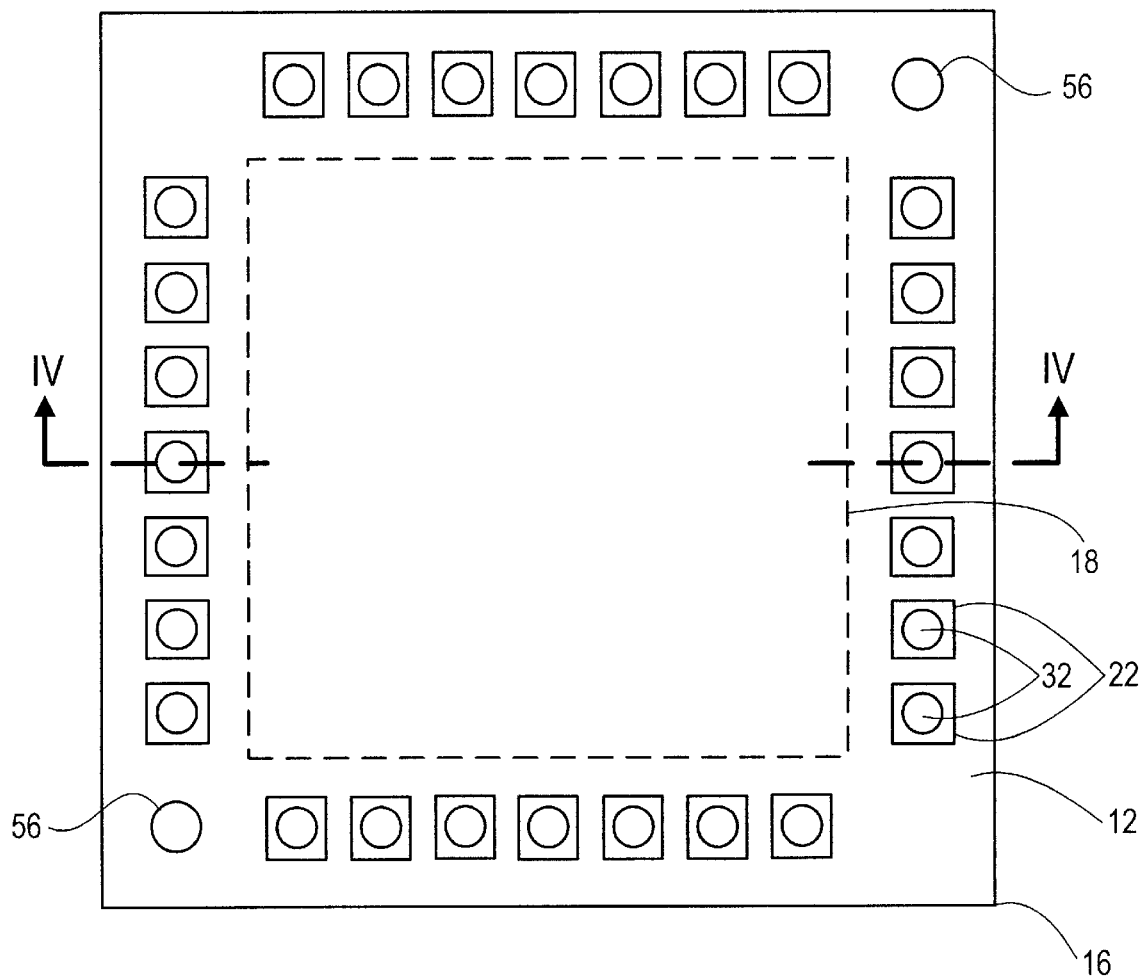
FIG. 3 is a top plan view of a semiconductor die for use in a CSP having stacked dies and no substrate in accordance with the present invention.

FIG. 2 shows a conventional semiconductor wafer 10 of the type typically employed in the semiconductor industry. Such wafers 10 are round, have opposite top and bottom surfaces 12 and 14, respectively, a diameter of from about 6–12 inches, a thickness of from about 10 to 35 mils (0.254 mm to 0.890 mm), where 1 mil=0.001 inch, or 0.025 millimeter, and may comprise, e.g., crystalline silicon, gallium arsenide, selenium, or germanium.

The wafer 10 may have from less than a dozen to more than several hundred integrated circuit ("IC") chips, or dies 16, integrally formed therein. The dies 16 are segregated from each other on the wafer 10 by mutually orthogonal "streets" 20, e.g., lines marked on or scribed into the top surface 12 of the wafer, and along which the wafer is cut to "singulate," i.e., separate, the individual dies 16 from it.

Each die 16 in the wafer 10 includes an identical electronic device 18 (shown by dotted outline in FIG. 3) formed in the first, or top, surface 12 thereof using conventional semiconductor fabrication techniques. Each electronic device 18 typically will include many hundreds or thousands of electronic circuit components, e.g., transistors, resistors, capacitors, and the like, which together, form a functioning electronic device 18, such as a memory device.

Each die 16 has a plurality of conventional wire bonding terminal pads 22 on its first surface 14 that are connected by conductive paths 24 (see FIG. 4) located below the first surface of the die to the electronic device 18 therein. In the embodiment shown in FIG. 2 and in the prior art package 110 shown in FIG. 1, the terminal pads 22 are located around the periphery of the first surface 12 of the die and outside of the electronic device 18 therein.

Figure 12:
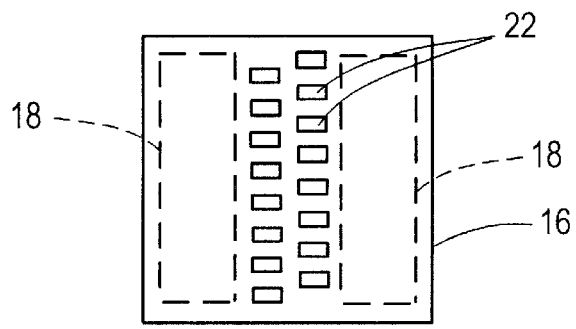
FIG. 12 is a top plan view of another semiconductor die for use in a CSP having stacked dies and no substrate in accordance with the present invention.

In other die 16 embodiments (see FIG. 12) to which the present invention has advantageous application, the terminal pads 22 may be located in one or more rows in the central portion of the die, with portions of the electronic device 18 located on either side thereof. The only limitation in the application of the present invention to either of the two embodiments of dies 16 discussed above is that the electronic device 18 should not be located directly below any of the terminal pads 22 on the die, because, in accordance with the present invention, holes are bored through the dies and terminal pads, as is described below, and any portions of the electronic device underlying the holes could be damaged thereby.

Figure 4:
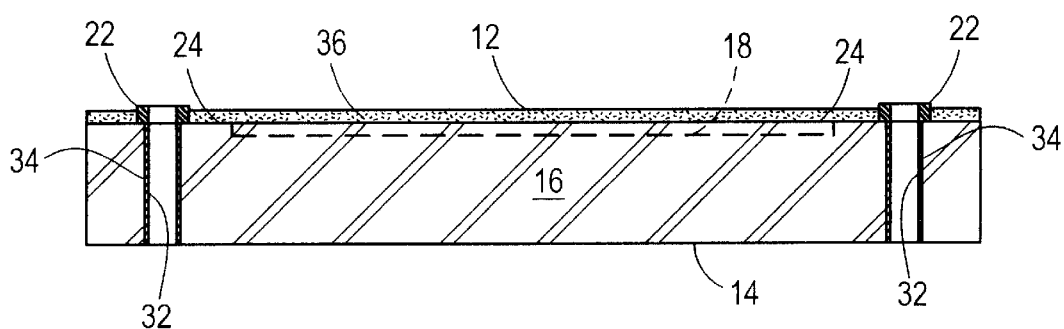
FIG. 4 is a cross-sectional elevation view into the die of FIG. 3 as revealed by the section taken therein along the lines IV—IV.

The method of the present invention begins with the provision of a semiconductor wafer 10, such as the one described above and illustrated in FIG. 2. FIG. 3 is a top plan view of a single die 16 singulated from the wafer 10 and used in the assembly of a stacked-die CSP 40 (see, e.g., FIG. 6) in accordance with the invention. A cross-sectional view of the die 16 taken in FIG. 3 along the lines IV—IV is shown in FIG. 4.

The method of the present invention further includes the formation of vias 32 in each of the dies 16 in the wafer 10. In particular, the vias 32 are formed to extend completely through the dies 16 and each terminal pad 22 thereon, as shown in FIGS. 3 and 4. Each via 32 has walls with an insulative, or dielectric, coating 34 formed thereon. The dielectric coating 34 on the walls of the vias 32 prevents an electrically conductive object subsequently inserted into the vias from shorting to the semiconductor material of the dies 16.

The vias 32 are formed by burning openings through the dies 16 and pads 22 with a laser. In one advantageous embodiment, the vias 32 are burned through the dies 16 and pads 22 with a programmable $CO_2$ laser, which has a sufficiently large fluence to burn the vias through at a temperature that is high enough to simultaneously form the insulative coating 34, namely, an oxide of the semiconductor material, e.g., $SiO_2$, on the walls of the via during its formation. By burning the openings through the wafer 10 at a temperature that is high enough to simultaneously form an oxide coating 34 on the walls of the vias 32, the additional processing step of forming the insulative coating on the walls of the vias is eliminated.

However, it should be understood that the vias 32 can be burned through the dies 16 and pads 22 with a laser, such as an excimer laser, that burns at a cooler temperature, i.e., one that is too low to reliably form a sufficiently thick and insulative oxide layer on the walls of the vias. In such an embodiment, the dielectric coating 34 can be formed on the walls of the vias 32 after the openings for the vias have been formed by exposing the wafer 10 to an atmosphere of steam at a temperature of from about 800–900° C. until the desired thickness of oxide on the walls of the vias has been obtained.

Figure 13:
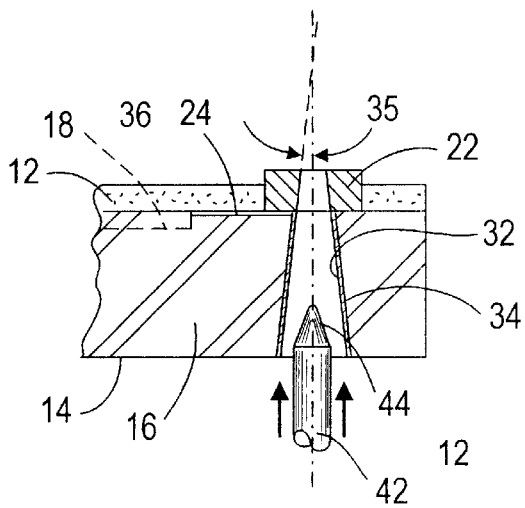
FIG. 13 is an enlarged partial cross-sectional view into a via in a semiconductor die in accordance with one embodiment of this invention.

An additional advantage of using a laser to form the vias 32 in the dies 16 is that the shape of the beam of the laser can be precisely controlled to form a taper 35 on the walls of the vias (see FIG. 13). In particular, the vias 32 can be made wider or narrower at one end than at the other and independently of the first or second surfaces 12 or 14 of the die 16 through which the vias 32 are burned. The taper 35 on the walls of each via 32 serves as a centering guide for the pointed end 44 of a conductive pin 42 (see FIG. 5) subsequently inserted through the via, as described in more detail below. Thus, in one possible embodiment, the terminal pads 22 are about 4 to 5 mils (0.102 to 127 mm) square, and the vias 32 are from about 1 to 3 mils (0.025 to 0.076 mm) in diameter at the pad end, and about 5 to 10 mils (0.127–0.254 mm) in diameter at the opposite end for easy insertion of a pin 42 therein. It is desirable that the diameter of the pin 42 be only slightly smaller than that of the via 32 at the pad 22 end thereof to facilitate the making of a solder joint between the pad and the pin, as described below.

Figure 14:
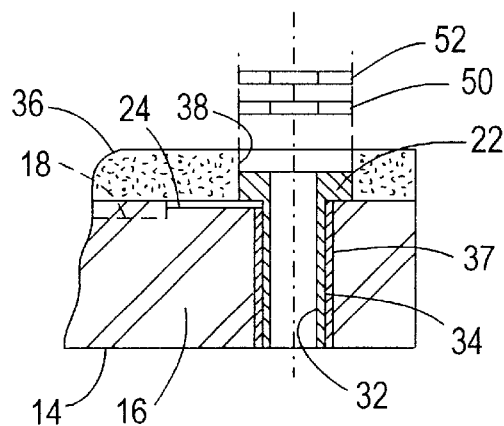
FIG. 14 is an enlarged partial cross-sectional view into a via in a semiconductor die in accordance with another embodiment of this invention.

In an alternative embodiment, one or more layers 37 of an electrically conductive material, e.g., copper or gold-over-nickel, is deposited over the dielectric coating 34 on the walls of the vias 32 to define conductive paths through the dies 16 between the respective terminal pads 22 and bottom surfaces 14 of the dies (see FIG. 14). The conductive layer 37 can be produced, e.g., by masking the surface of the wafer 10 except for the vias 32 and the terminal pads 22, then sputtering or plating the metal onto the wafer using known metallization techniques.

Although a passivation layer (not illustrated) typically formed on at least the top surface 12 of the wafer 10 during fabrication of the electronic devices 18 is sufficient to protect the electronic devices against environmental agents, including moisture, it may be desirable in some applications to apply an additional insulative coating 36, e.g., a thicker layer of oxide, a polyimide resin, Paralene, or spun-on glass, over the top surface 12 of the wafer, as shown in FIG. 4, to provide additional protection for the electronic devices.

In one embodiment of the method, after the wafer 10 has been processed as described above, the individual dies 16 are first tested and marked, and then singulated from the wafer using conventional wafer dicing methods. Good dies are segregated for use in the assembly of stacked-die CSPs 40 as described below.

Figure 5:
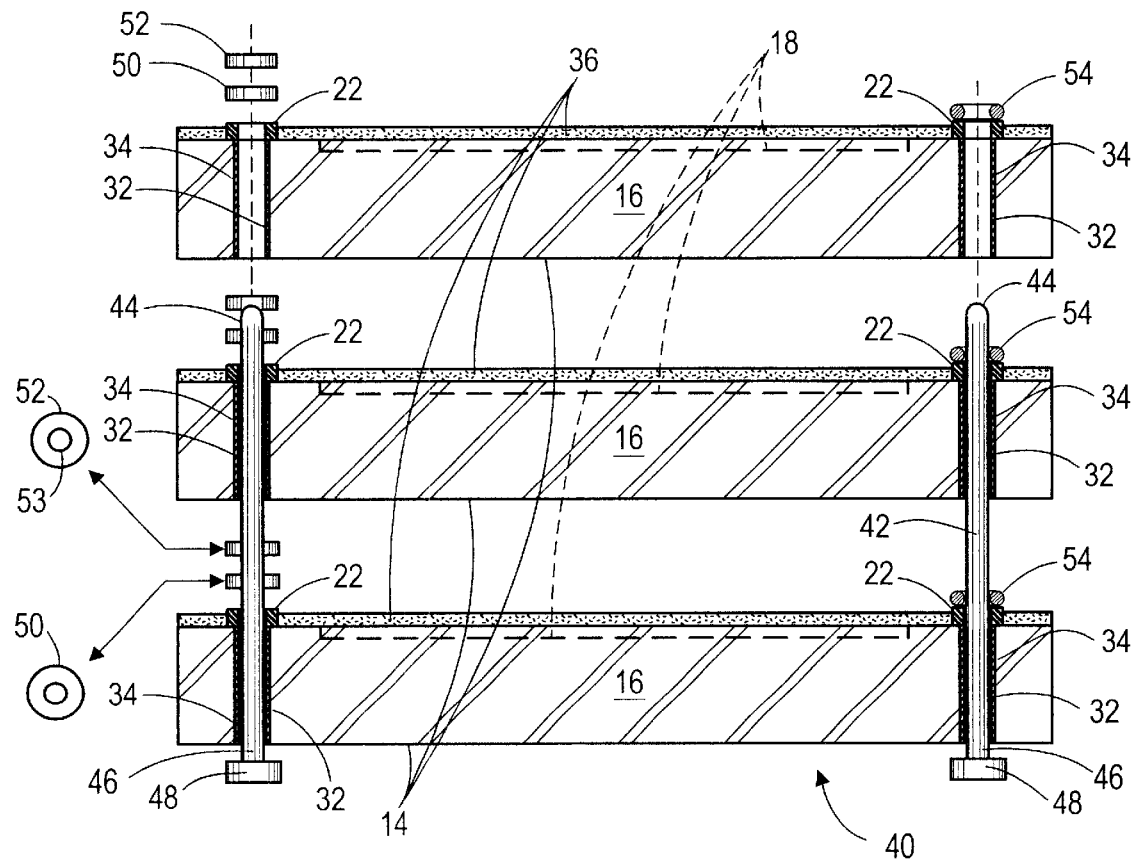
FIG. 5 is a cross-sectional elevation view into a CSP containing three stacked dies in accordance with a first exemplary embodiment of the present invention, with the dies shown spaced apart vertically for clarity.
Figure 6:
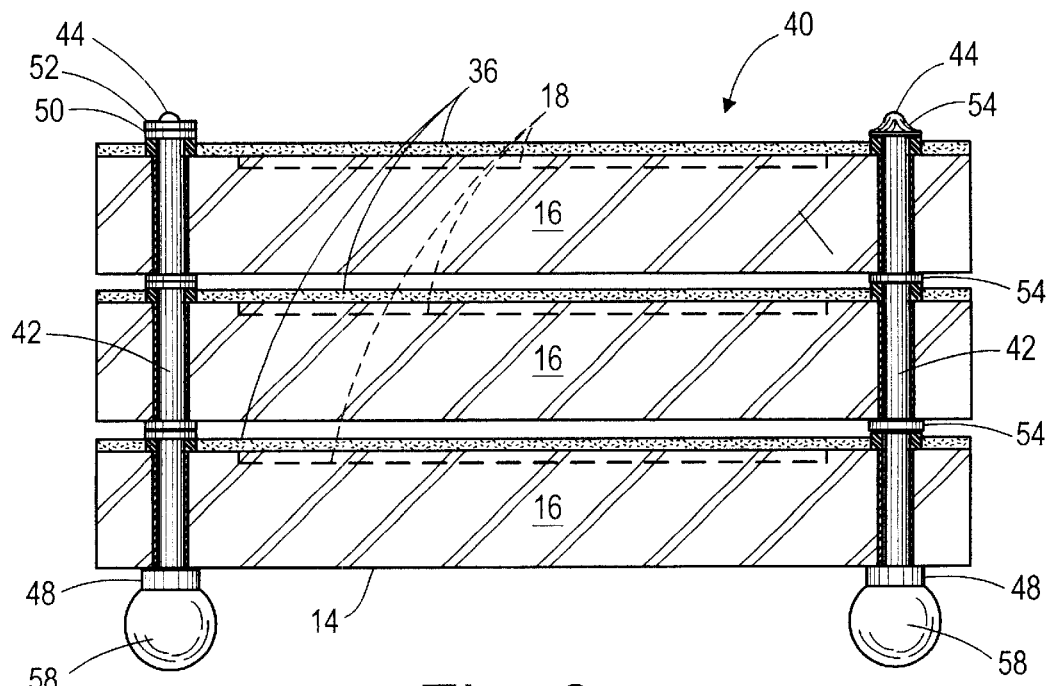
FIG. 6 is a cross-sectional elevation view into the three-die CSP shown in FIG. 5 after assembly.
Figure 15:
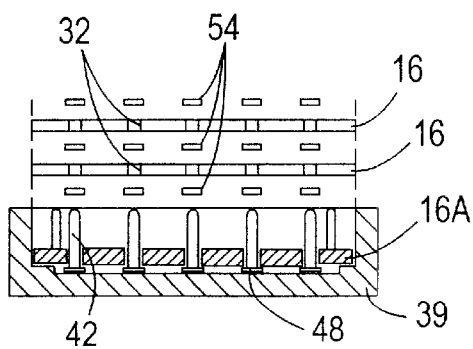
FIG. 15 is an expanded cross-sectional elevation view into a stack of semiconductor dies in a holding fixture in accordance with one embodiment of this invention; and, FIG. 16 is a partial cross-sectional elevation view into a stack of semiconductor dies in a holding fixture in accordance with another embodiment of this invention.

FIGS. 5 and 6 illustrate the assembly of a first exemplary embodiment of a CSP 40 incorporating three stacked dies 16 in accordance with the present invention. In one possible variant of the assembly method, a plurality of rigid, electrically conductive pins 42 are held pointed-end-upright in a fixture 39 and in a pattern corresponding to the pattern of vias 32 in the individual dies 16 of the CSP 40 (see FIG. 15). For this purpose, the pins 42 can be inserted through the respective vias 32 of a single die 16A from its bottom side. As shown in FIG. 15, the die 16A is then placed bottom-side-down in the fixture 39, with the pins 42 pointing up to receive additional dies 16 stacked thereon. The first die 16A thereby serves to position the pins 42 accurately, and becomes the lowermost die in the subsequent stack of dies assembled thereon.

The pins 42 have a first, pointed end 44 and a second end 46 opposite to the first end that, in one embodiment, is flattened into a pad 48, such as that shown in FIGS. 5 and 6. The pins 42 are made of metal, e.g., copper, aluminum, tungsten, steel or titanium, have precisely controlled dimensions, and in one embodiment, are plated with a metal to which solder readily adheres, e.g., solder or gold-over-nickel.

In the first embodiment, as illustrated in FIGS. 5 and 15, the vias 32 in each die 16 of the nascent stack are positioned over the respective first ends 44 of the pins 42, and the dies are then slid, one die at a time, down onto the pins, bottom side 14 first, until the desired number of dies in the stack has been obtained. The pins 42 are then soldered to corresponding ones of the terminal pads 22 on the respective dies 18 in one of several possible methods.

One variant of the soldering method is shown on the left-hand side of FIG. 5. There, after each die 16 is slid down onto the pins 42, first and second annular disks 50 and 52 are slid down onto each pin 42 such that they encircle the pin on the surface of a corresponding one of the terminal pads 22 on the die. The first disk 50 is made of solder, e.g., eutectic solder, or a lead-free solder, and in one advantageous embodiment, the second disk 52 is made of solder-plated Kovar, or alternately, solder-plated "Alloy 42." The second disks 52 are used in combination with the first disks 50 to effect wicking of the molten solder of the first disk up into the central aperture 53 of the second disk 52, thereby wetting the circumference of the pin 42 extending through the aperture with solder. By making the second disks 52 of Kovar or Alloy 42, the stresses incident on the dies 16 with large changes in temperature due to a difference in the respective thermal coefficients of expansion of the dies and the disks is avoided.

After the desired number of dies 16 and interleaving first and second disks 50 and 52 have been assembled onto the pins 42, the entire assembly, including the holding fixture, is heated, e.g., in a conveyor oven, to reflow, or melt, the solder in the first disk 50, and thereby electrically connect the dies 18 to the respective pins and to each other.

In another variant of the soldering method, shown on the right-hand side of FIG. 5, after each die 16 is slid down onto the pins 42, a ring of solder paste 54, comprising particles of solder dispersed in a paste of flux, is deposited on the each of the terminal pads 22 on the die such that they encircle the pin passing therethrough. The use of the solder paste rings 54 is advantageous in that, when the paste is dispensed onto the terminal pads, it is compressed in a radial direction, and hence, into contact with the circumference of the pin 42 extending therethrough. This effect is enhanced by the weight of the dies 16 subsequently added to the stack, which further flatten the rings of solder paste 54 radially. As in the first variant of the soldering method described above, after the desired number of dies 16 and interleaving rings of solder paste 54 have been assembled onto the pins 42 and compressed together, the entire stack is heated to reflow the solder in the rings of solder paste 54 and thereby electrically connect the dies to the pins and to each other.

Figure 16:
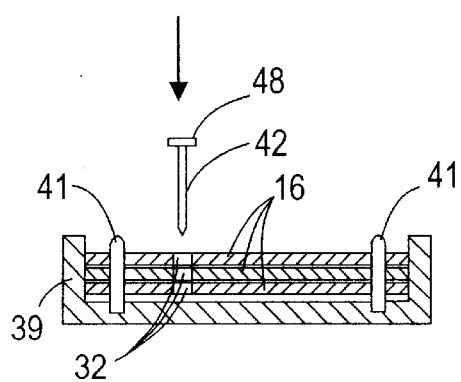

In another possible assembly embodiment, the individual dies 16 are stacked on top of one another in a holding fixture or jig such that corresponding ones of their respective vias 32 are coaxially aligned with each without using the conductive pins 42 (see FIG. 16). In such an embodiment, it is desirable to form a pair of tooling holes 56 (see FIG. 3) in each die 16, which can be formed concurrently with and using the same laser apparatus used to form the vias 32 in the dies. The tooling holes 56 are used in conjunction with a pair of alignment pins 41 (see FIG. 16) mounted in the holding fixture to position the dies 16 such that corresponding ones of their respective vias 32 are aligned coaxially with each other.

As in the embodiments described above and shown in FIGS. 5 and 6, the dies 16 in the stack are interleaved with either the annular soldering disks 50 and 52, or alternatively, solder paste 54 deposited on the terminal pads 22, to effect subsequent soldering of the pins 42 to the pads. In this regard, it may be noted in, e.g., FIGS. 5, 6, and 13, that the optional insulative coating 36 on the first surface 12 of the respective dies 16 is thinner than the terminal pads 22, such that the surfaces of the pads are positioned slightly above the surface of the coating, like mesas. However, it is possible, by appropriately masking the terminal pads 22 and by increasing the relative thickness of the insulative coating 36, to create recesses 38 (see FIG. 14) in the coating around the pads that serve to position and retain the annular disks 50, 52, or alternatively, the deposits of solder paste 54, therein and in contact with the pads. Indeed, in such an embodiment, the solder paste 54 can be applied to the surfaces of the terminal pads 22 by simply screeding the paste onto the upper surface 12 of the dies 16 and into the recesses 38 with, e.g., a wiper blade.

As shown in FIG. 16, when the alternating stack of dies 16 and disks 50, 52, or alternatively, deposits of solder paste 54, is complete and the vias 32 in coaxial alignment on the fixture, the pins 42 are inserted into corresponding ones of the coaxially aligned vias 32 until the pins extend completely through the stack. As discussed above in connection with FIG. 13, a taper 35 can formed on the walls of the vias 32 to serve as a centering guide for the pointed ends 44 of the pins 42 to aid in their insertion into the vias. If deposits of solder paste 54 are used as the soldering mechanism, the pins 42 will sequentially pierce the deposits to form flattened rings thereof on each terminal pad 22, similar to the soldering embodiments scribed above in connection with FIG. 5, and simultaneously, will become coated with the paste along their respective lengths as they penetrate into the stack of dies.

As in the soldering embodiments described above in connection with FIG. 5, after the pins 42 have been inserted into the stack, the entire assembly, including the fixture, is heated in an oven to reflow the solder in the annular disks 50, 52, or alternatively, the rings of solder paste 54, thereby effecting an electrical connection between the respective dies 16 and pins 42. The three-die stacked CSP 40 resulting from any one of the variants of the method described above is shown in the crosssectional elevation view of FIG. 6.

In yet another possible variant of the method of electrical interconnection of the dies 16, a layer 37 (see FIG. 14) of a metal is deposited over the dielectric coating 34 on the walls of the vias 32, as described above. The pin 42 is likewise plated with a coating of solder. In this embodiment, electrical interconnection between the dies 16 and pins 42 is effected without use of the soldering disks 50, 52, or the rings of solder paste 54 described above, by simply reflowing the solder on the pins, causing it to melt, wet, and thereby connect to the metal layer 37 on the walls of the vias 32.

It is typical to make some provision in semiconductor packages for electrical interconnection of the package with associated electronics, e.g., components on an associated PCB. In the first embodiment of the CSP 40 illustrated in FIG. 6, this input-output terminal function is met by the pads 48 at the second ends of the pins 42, which enable the CSP 40 to connect to a PCB (not illustrated) in the same fashion as a conventional Land Grid Array ("LGA") package. Alternatively, as shown in FIG. 6, balls 58 of gold or solder can be attached to the respective bottom surfaces of the pads 48 to enable the CSP 40 to be connected to a PCB in the same manner as a conventional Ball Grid Array ("BGA") package.

Figure 7:
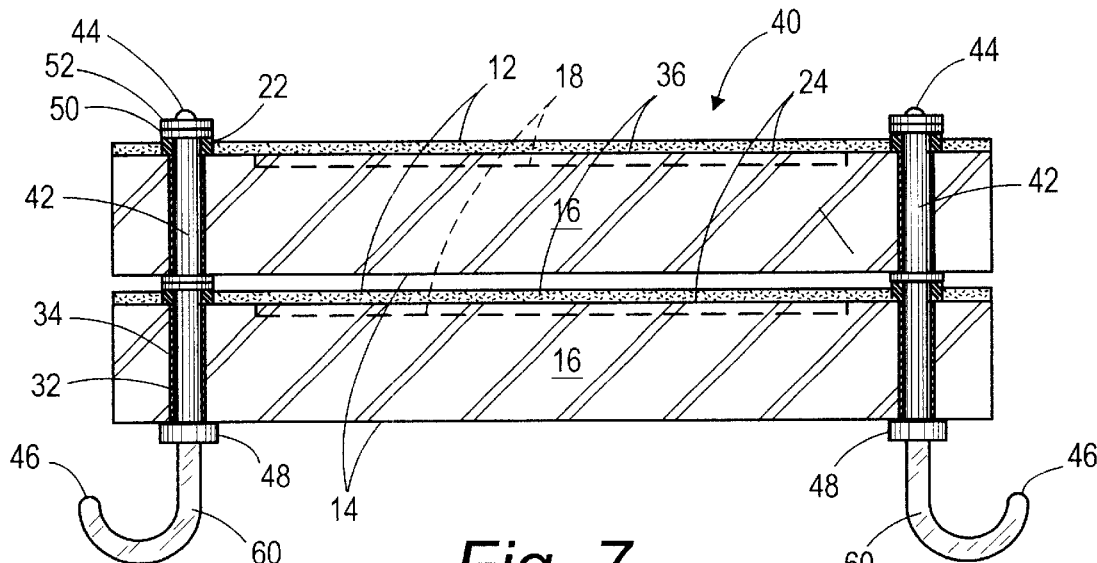
FIG. 7 is a cross-sectional elevation view into a CSP containing two stacked dies in accordance with a second exemplary embodiment of the present invention.
Figure 8:
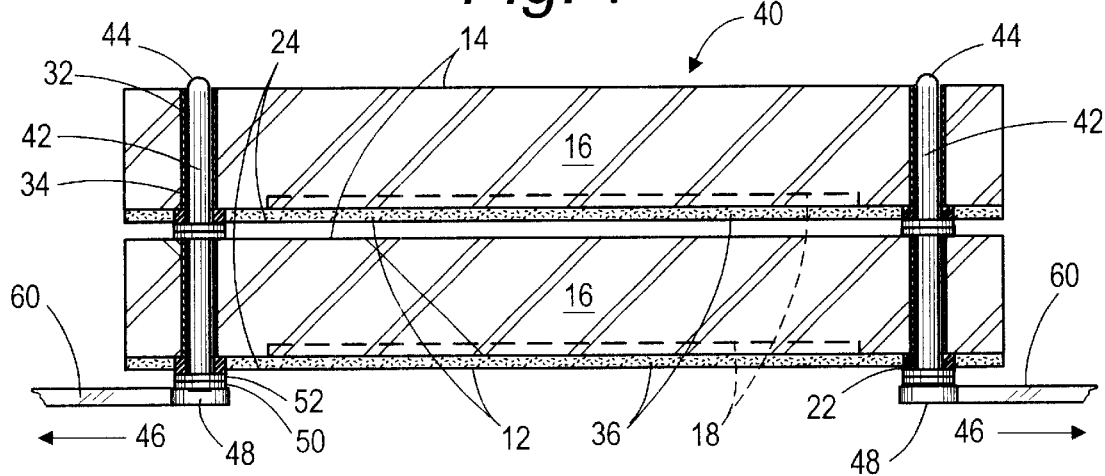
FIG. 8 is a cross-sectional elevation view into a CSP containing two stacked dies in accordance with a third exemplary embodiment of the present invention.
Figure 9:
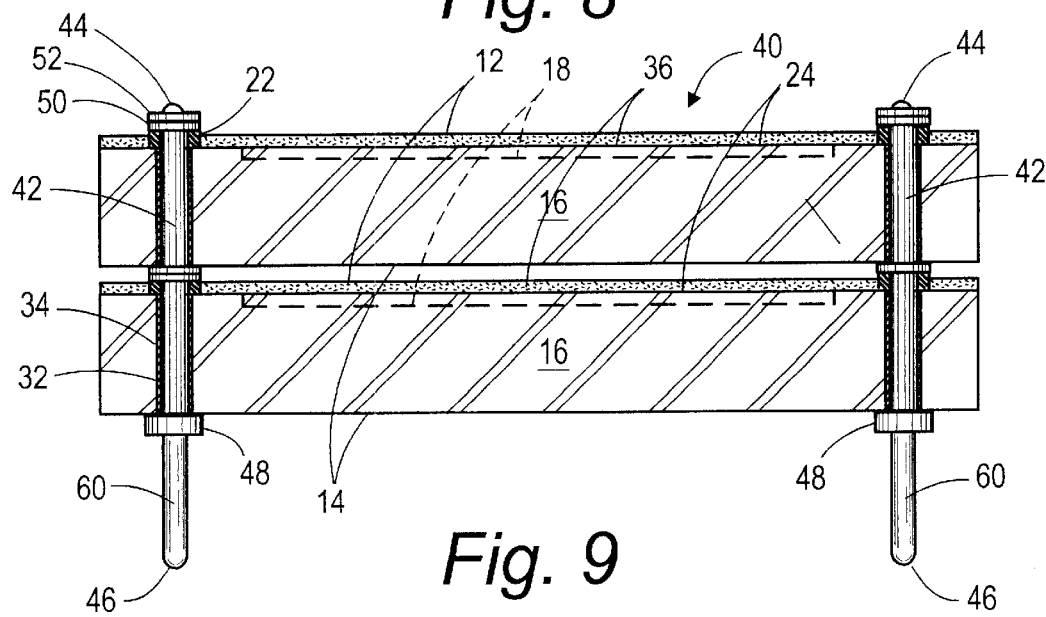
FIG. 9 is a cross-sectional elevation view into a CSP containing two stacked dies in accordance with a fourth exemplary embodiment of the present invention.

FIGS. 7, 8, and 9 respectively illustrate second, third, and fourth exemplary embodiments of a two-die, stacked-die CSP 40 in accordance with the present invention. In each embodiment, a portion 60 of each pin 42 protrudes below a lower surface of the lowermost die 16 in the stack, and has been formed into an alternative embodiment of an input-output terminal of the CSP 40, namely, a formed lead or pin. In the second embodiment shown in FIG. 7, the lower portions 60 of the pins 42 have been formed into a curved lead that solders to a PCB. In the third embodiment of CSP 40 shown in FIG. 8, the protruding portions 60 of the pins 42 are fashioned as flat leads that connect to the pads 48 of the pins at a right angle, and that exit the package in a manner similar to the leads of a conventional lead frame type of package. In the fourth embodiment of CSP 40 shown in FIG. 9, the lower portions 60 of the pins 42 have been formed into straight pins that can engage complementary openings in a PCB or sockets in a PCB-mounted connector (not illustrated).

The third embodiment of CSP 40 shown in FIG. 8 illustrates another feature of the package of the invention, namely, that the dies 16 can be inverted in the stack of the package relative to the pins 42 without effecting the function of the package. Thus, the pins 42 can be inserted through the first surfaces 12 of the dies 16, instead of though the second surfaces 14 of the dies, as in the other embodiments illustrated, and the first, or top, surface 12 of the lowermost die 16 then becomes the bottom surface of the CSP 40, as shown in FIG. 8.

This latter feature permits another alternative embodiment of CSP 40 to be fabricated in which fine conductive wires can be substituted for the conductive pins 42. In such an embodiment, two or more dies 16 are stacked in a fixture with their corresponding vias 32 in coaxial alignment, and with deposits of solder paste 54 on the respective terminal pads 22 of the dies, as described above and illustrated in FIG. 16. The tip of the capillary of a conventional wire bonder (not illustrated) is then placed over each set of aligned vias 32, and a length of fine, conductive wire, e.g., aluminum or gold bonding wire, is fed by the wire bonder through each set of aligned vias, from one side of the stack to the other. The wires are then soldered to the corresponding terminal pads 22 on each die in the same manner as the pins 42 described above, namely, in an oven-reflow process. The wires are then trimmed flush with respective ones of the two opposite surfaces of the stack. Depending on the arrangement of the dies 16 in the stack, the terminal pads 22 on the lower surface of the lowermost die 16 in the stack, or alternatively, on the upper surface of the uppermost die in the stack, then function as the input-output terminals of the resulting package 40.

Figure 10:
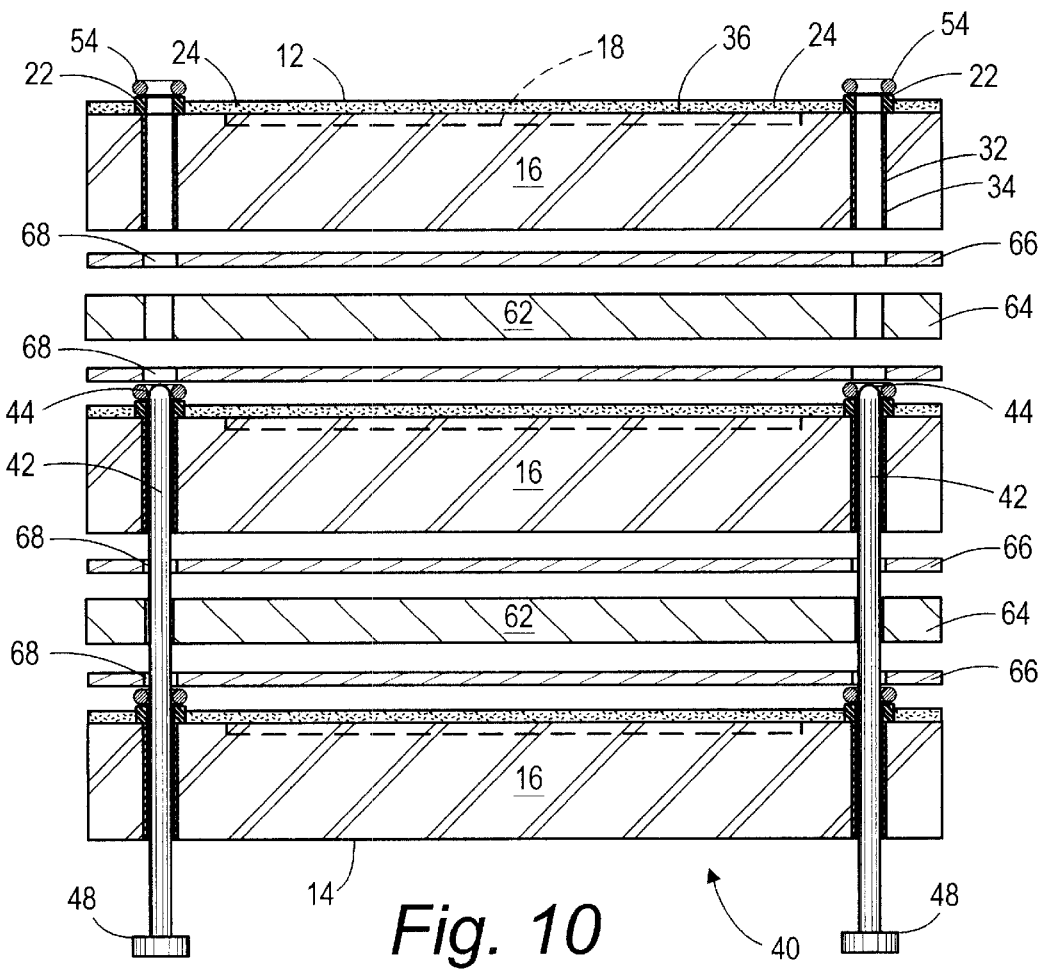
FIG. 10 is a cross-sectional elevation view into a CSP containing three stacked dies and two interleaved heat spreaders in accordance with a fifth exemplary embodiment of the present invention, with the dies and heat spreaders shown expanded apart vertically for clarity.
Figure 11:
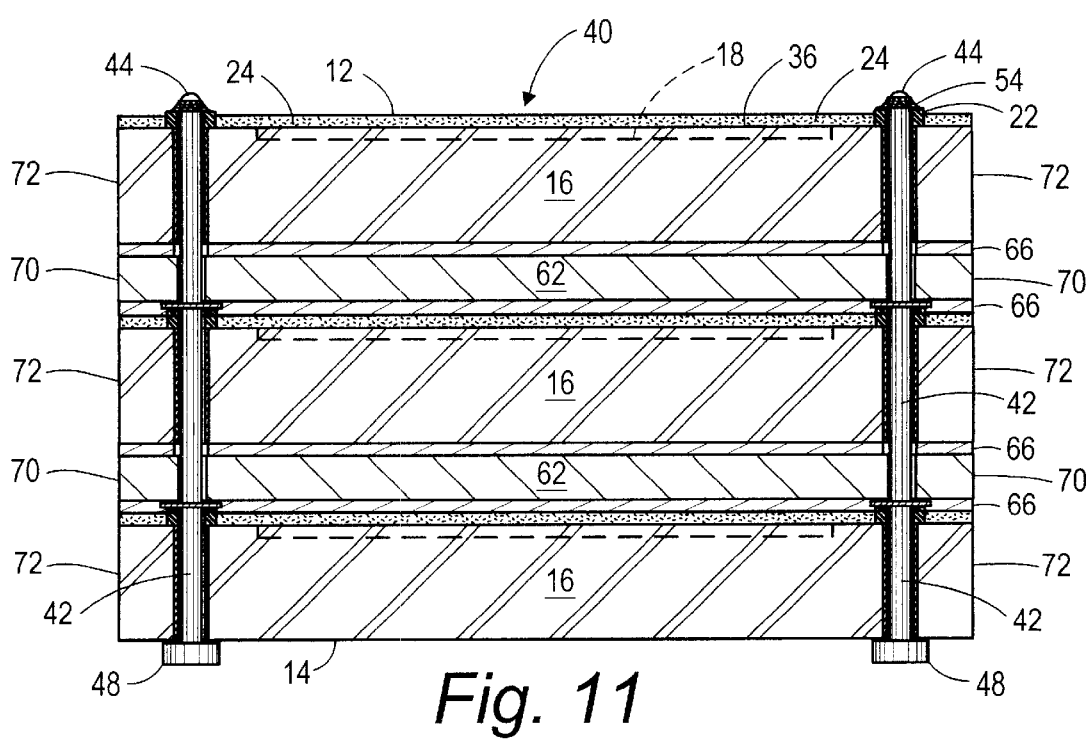
FIG. 11 is a cross-sectional elevation view into the three-die CSP with interleaved heat spreaders shown in FIG. 10 after assembly.

FIGS. 10 and 11 illustrate a fifth exemplary embodiment of a CSP 40 with stacked dies 16 that provide an enhanced heat dissipating capability. Specifically, the novel CSP 40 illustrated incorporates heat spreaders 62 interleaved between and thermally coupled to each pair of immediately adjacent dies 16 in the stack. The heat spreaders 62 function to conduct heat generated in the dies 16 during operation to the exterior surface of the package 40.

The heat spreaders 62 are fabricated of a thermally conductive material, e.g., a metal, such aluminum, copper, or a copper-tungsten alloy. The heat spreaders 62 can be stamped, machined, or etched from a sheet of the material using conventional machining techniques.

As illustrated in the expanded view of the assembly in FIG. 10, the assembly, or lay-up, of the CSP 40 is similar to those of the embodiments previously described. The soldering mechanism illustrated comprises rings of solder paste 54, as described above. Each of the heat spreaders 62 includes a plurality of clearance openings 64 arranged in a pattern corresponding to the pattern of vias 32 in the respective dies 16. In the embodiment illustrated, the surfaces of the heat spreaders 62 are bonded to the opposing first and second surfaces 12 and 14 of the dies 16 with a die-cut sheet 66 of a heat-curing adhesive film interposed between the respective surfaces. The adhesive sheet 66 also includes a pattern of clearance holes 68 corresponding to those in the heat spreaders 62. If desired, an additional heat spreader 62 can be mounted on one or both of the lower surface of the lowermost die 16 in the stack and the upper surface of the uppermost die in the stack such that each die in the stack has both of its first and second surfaces 12 and 14 thermally coupled to a heat spreader.

In another embodiment, the opposing surfaces of the dies 16 and heat spreaders 62 can be bonded to each other with a layer 66 of a liquid or paste adhesive that is dispensed onto a respective one of the surfaces with a nozzle, or in the case of a liquid adhesive, sprayed thereon in aerosol form. The adhesive layer 66 can be filled with particles of a thermally conductive material, e.g., silver, to enhance the thermal conductivity of the adhesive, and soldering disks 50 and 52 can be used in lieu of the rings of solder paste 54, as described above.

As with the previously described embodiments, the assembled CSP 40 is heated to effect reflow soldering of the pins 42 to the corresponding terminal pads 22. If an appropriate heat-curing adhesive is employed in the adhesive sheet or layer 66, the adhesive can be cured simultaneously with the reflowing of the solder connections.

The completed CSP 40 with interleaved heat spreaders 62 is illustrated in the cross-sectional elevation view of FIG. 11. In the particular embodiment illustrated, the side walls 70 of the heat spreaders 62 are made flush, i.e., coplanar, with the side walls 72 of the dies 16. This arrangement permits, e.g., a pair of finned, U-shaped heat radiators (not illustrated) to be mounted on each pair of the opposite side walls of the CSP 40 to enhance its heat dissipating capability. In another possible embodiment (not illustrated), the side walls 70 of the heat spreaders 62 can be extended beyond the side walls 72 of the dies 16 and castellated to form convective cooling fins thereon.

As those of skill in the packaging art will by now appreciate, many modifications, variations, and substitutions are possible in the method and materials of the present invention without departing from its spirit and scope. For example, the stacked-die CSPs 40 may contain more dies than the two- or three-die stacks described and illustrated herein. In another possible embodiment, the vias 32 in the dies 16 and/or the clearance openings 64 in the heat spreaders 62 can modified to open slots that intersect the respective side walls 72 and 70 thereof. Such a configuration would permit, e.g., the insertion of the pins 42 into the vias 32 laterally, as opposed to longitudinally, or the cleaning of excess flux from around the pins and on the terminal pads 22 after soldering.

In view of the foregoing, it is submitted that the scope of the present invention should not be limited by the particular embodiments illustrated and described herein, as these are merely exemplary in nature. Rather, the scope of the present invention should be commensurate with that of the claims appended hereafter and their substantial equivalents.

What is claimed is:

1. A chip size semiconductor package ("CSP") with stacked dies, the CSP comprising:

two or more semiconductor dies mounted on top of one another in a stack, each die having opposite first and second surfaces, an electronic IC device in the first surface thereof, a plurality of input-output terminal pads on the first surface thereof and in electrical connection with the electronic device therein, and a plurality of vias, with each said via extending through the die and a respective one of the terminal pads thereon, each said via having walls with a dielectric coating thereon and being coaxially aligned with a corresponding said via in the other dies; and, a plurality of electrically conductive pins each inserted through the coaxially aligned vias of the dies of the stack and electrically connected to corresponding ones of the terminal pads on each said die in the stack, each said pin having a portion protruding below a lower surface of a lowermost said die in the stack or an upper surface of an uppermost said die in the stack and comprising an input-output terminal of the CSP.

2. The CSP of claim 1, wherein the walls of the vias are tapered.

3. The CSP of claim 1, wherein the vias are located in a peripheral portion of each die and outward of the electronic device therein.

4. The CSP of claim 1, wherein the vias are located in a central portion of each die and inward of the electronic device therein.

5. The CSP of claim 1, wherein each pin is soldered to corresponding ones of the terminal pads.

6. The CSP of claim 1, further comprising an annular disk disposed on a corresponding one of the terminal pads and encircling a corresponding one of the pins, and wherein the disk is soldered to the corresponding pin and pad.

7. The CSP of claim 1, further comprising a metal layer deposited over the dielectric coating on the walls of each via and in electrical connection with a corresponding one of the terminal pads, and wherein the pins are soldered to the metal layers.

8. The CSP of claim 1, further comprising a heat spreader interleaved between and in thermal connection with one or more pairs of immediately adjacent dies in the stack.

9. The CSP of claim 8, further comprising a heat spreader mounted on and in. thermal connection with a lower surface of a lowermost die in the stack or an upper surface of an uppermost die in the stack.

10. The CSP of claim 1, further comprising a ball of solder on the protruding portion of each pin.

11. The CSP of claim 1, wherein the protruding portion of each pin comprises a pad or a lead.

12. A semiconductor package comprising:

first and second semiconductor dies stacked one on the other, each die having opposite active and inactive surfaces, a plurality of terminal pads on the active surface thereof, and a plurality of vias extending through each die between the active and inactive surfaces thereof, wherein each said via extends through one of said terminal pads and has an inner wall with a dielectric coating thereon, and each said via is coaxially aligned with a corresponding one of the vias of the other of the first and second semiconductor dies; and a plurality of electrically conductive pins, wherein each said pin extends through the coaxially aligned vias of the first and second semiconductor dies and is electrically coupled to the terminal pads of the first and second dies through which the via extends.

13. The semiconductor package of claim 12, wherein the inner wall of each said via of the first and second semiconductor dies includes a metal layer over the dielectric coating, said metal layer being electrically coupled to the terminal pad through which the via extends.

14. The semiconductor package of claim 13, wherein the pin in the via is soldered to the metal layer.

15. The semiconductor package of claim 12, further comprising a solder ball fused to an end of each pin.

16. The semiconductor package of claim 12, further comprising a metal heat spreader disposed between the first and second semiconductor dies without contacting said pins.

17. The semiconductor package of claim 12, wherein each pin includes a bent portion adapted for electrical coupling of the first and second semiconductor dies to external circuitry.

18. The semiconductor package of claim 12, wherein each said pin includes a pad at an end of the pin, said pad being perpendicular to a shaft of the pin and having a periphery larger than a periphery of the via hole.

19. The semiconductor package of claim 12, wherein each of the first and second semiconductor dies includes an insulative layer disposed over the active surface thereof excluding the terminal pads.

20. The semiconductor package of claim 19, wherein the electrically conductive material comprises a metal solder or a solder paste.

21. The semiconductor package of claim 12, wherein a layer of an electrically conductive material on each said terminal pad electrically couples the terminal pad to the pin extending through the terminal pad.

22. The semiconductor package of claim 12, further comprising a plurality of metal rings, wherein one said metal ring is on each said terminal pad and is electrically coupled to the terminal pad and the pin extending through the terminal pad.

23. The semiconductor assembly of claim 22, wherein the first and second semiconductor dies each include a plurality of holes, with each hole extending between the active and inactive surfaces thereof and having an inner wall, with said pin extending through said hole, said pin being electrically isolated from the inner wall of the hole.

24. The semiconductor package of claim 22, wherein a layer of an electrically conductive material is on each said terminal pad and electrically couples the terminal pad to the pin extending through the terminal pad.

25. The semiconductor package of claim 22, further comprising a plurality of metal rings, wherein one said metal ring is on each said terminal pad and is electrically coupled to the terminal pad and the pin extending through the terminal pad.

26. The semiconductor package of claim 12, wherein the walls of the vias are tapered.

27. The semiconductor assembly of claim 26, wherein a dielectric coating on the inner wall of the hole electrically isolates said pin from the inner wall.

28. A semiconductor assembly comprising:

first and second semiconductor dies stacked one on the other, each die having opposite active and inactive surfaces, and a plurality of terminal pads on the active surface, thereof; and a plurality of electrically conductive pins, wherein each said pin extends through the first and second semiconductor dies between the active and inactive surfaces thereof and through corresponding ones of the terminal pads of the first and second semiconductor dies, with each pin being electrically coupled to the terminal pads through which the pin extends, thereby electrically interconnecting the first and second semiconductor dies.

* * * * *